United States Patent
Chiu et al.

(10) Patent No.: US 9,391,113 B2
(45) Date of Patent: Jul. 12, 2016

(54) IMAGE-SENSOR DEVICE STRUCTURE AND METHOD OF MANUFACTURING

(71) Applicant: Taiwan Semiconductor Manufacturing Co., Ltd., Hsin-Chu (TW)

(72) Inventors: Cheng-Ming Chiu, New Taipei (TW); Chun-Yan Chen, Zhubei (TW); Chyi-Tsong Ni, Hsinchu (TW); Ruei-Hung Jang, Jhubei (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 13 days.

(21) Appl. No.: 14/158,230

(22) Filed: Jan. 17, 2014

(65) Prior Publication Data
US 2015/0206917 A1 Jul. 23, 2015

(51) Int. Cl.
*H01L 31/00* (2006.01)
*H01L 27/146* (2006.01)
*H01L 21/768* (2006.01)

(52) U.S. Cl.
CPC ........ *H01L 27/14636* (2013.01); *H01L 21/768* (2013.01); *H01L 27/14683* (2013.01)

(58) Field of Classification Search
CPC .................. H01L 21/768; H01L 27/14683
USPC ............................................ 257/459; 438/98
See application file for complete search history.

(56) References Cited

U.S. PATENT DOCUMENTS

| | | | | |
|---|---|---|---|---|
| 7,294,873 B2* | 11/2007 | Suzuki | ............. | H01L 27/14609 257/184 |
| 8,319,230 B1* | 11/2012 | Dutta | ................. | G02B 6/12002 257/432 |
| 8,816,457 B2* | 8/2014 | Hung | ................ | H01L 27/14621 257/431 |
| 2006/0183265 A1* | 8/2006 | Oh | .................... | H01L 27/14632 438/65 |
| 2007/0023799 A1* | 2/2007 | Boettiger | .......... | H01L 27/14625 257/292 |
| 2008/0036020 A1* | 2/2008 | Ko | .................... | H01L 27/14621 257/431 |
| 2008/0116537 A1* | 5/2008 | Adkisson | .......... | H01L 27/14618 257/448 |
| 2008/0122078 A1* | 5/2008 | He | .................... | H01L 21/76834 257/737 |
| 2009/0160983 A1* | 6/2009 | Lenchenkov | ..... | H01L 27/14632 348/294 |
| 2010/0230583 A1* | 9/2010 | Nakata | .............. | H01L 27/14621 250/227.2 |
| 2011/0032398 A1* | 2/2011 | Lenchenkov | ..... | H01L 27/14621 348/294 |
| 2011/0220889 A1* | 9/2011 | Kurokawa | ............. | G02F 1/1362 257/43 |
| 2012/0105692 A1* | 5/2012 | Ackerson | .......... | H01L 27/14623 348/294 |

* cited by examiner

*Primary Examiner* — Matthew Landau
*Assistant Examiner* — Igwe U Anya
(74) *Attorney, Agent, or Firm* — Birch, Stewart, Kolasch & Birch, LLP

(57) ABSTRACT

Embodiments of an image-sensor device structure and a method of manufacturing thereof are provided. The image-sensor device structure includes a semiconductor substrate and a light-sensing region in the semiconductor substrate. The image-sensor device structure also includes an interconnect structure over the semiconductor substrate, and the interconnect structure includes a transparent dielectric layer over the light-sensing region. The transparent dielectric layer has an optical transmittance ranging from about 90% to about 97%.

20 Claims, 8 Drawing Sheets

IMAGE-SENSOR DEVICE STRUCTURE AND METHOD OF MANUFACTURING

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs. For these advances, similar developments in IC processing and manufacturing are developed.

Along with the advantages gained from reducing geometric size, improvements are being made directly to the IC devices. One such IC device is an image-sensor device. An image-sensor device includes a pixel array (or grid) for detecting light and recording intensity (brightness) of the detected light. For example, the pixel array responds to the light by accumulating a charge. The higher the intensity of the light is, the higher the charge is accumulated in the pixel array. The accumulated charge is used (for example, by other circuitry) to provide image information for use in a suitable application, such as a digital camera.

It is desirable to form image-sensor devices with improved performance and reliability.

BRIEF DESCRIPTION OF THE DRAWINGS

For a more complete understanding of the illustrative embodiments and the advantages thereof, reference is now made to the following descriptions taken in conjunction with the accompanying drawings.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It should be understood that the following disclosure provides many different embodiments, or examples, for implementing different features of the disclosure. Specific examples of components and arrangements are described below to simplify the present disclosure. These are merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of illustrative embodiments are described. Throughout the various views and the illustrative embodiments, like reference numbers are used to designate like elements.

Figure 1:
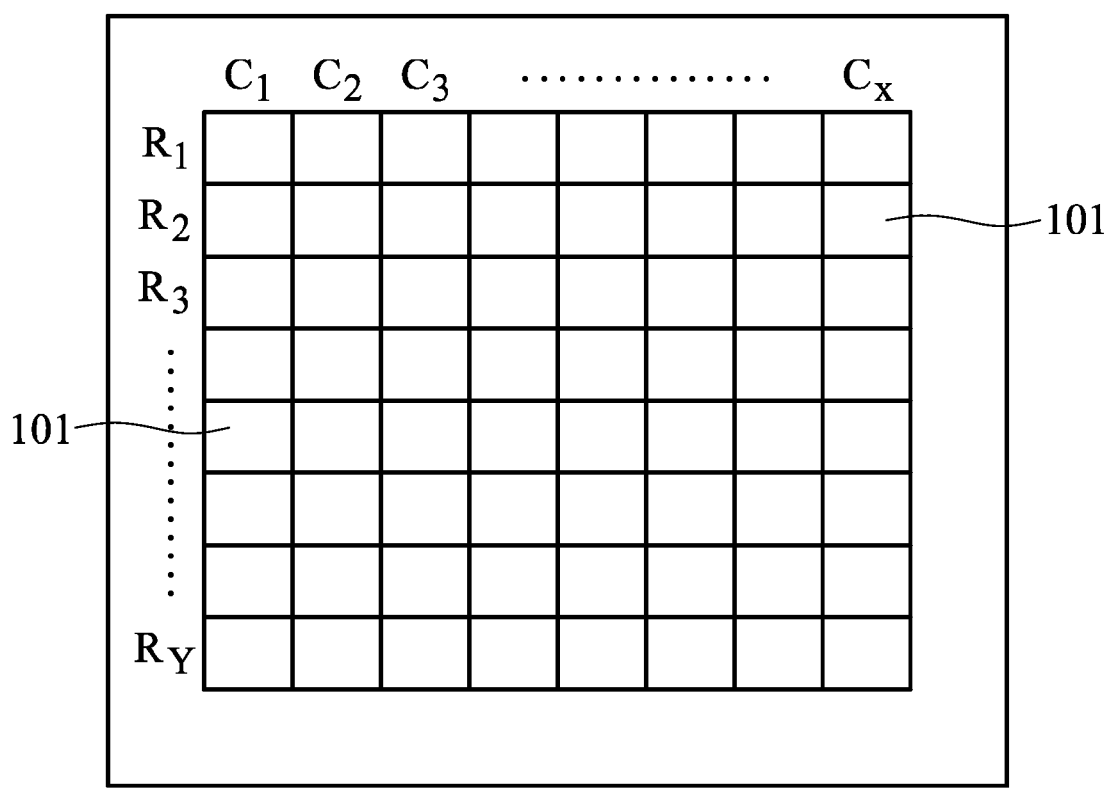
FIG. 1 is a top view of an image-sensor device structure, in accordance with some embodiments.

FIG. 1 is a top view of an image-sensor device structure 100, in accordance with some embodiments. In some other embodiments, the image-sensor device structure 100 includes a front side illuminated (FSI) image-sensor device structure. In some other embodiments, the image-sensor device structure 100 includes a backside illuminated (BSI) image-sensor device structure, an FSI image-sensor device structure, or a combination thereof.

In some embodiments, the image-sensor device structure 100 includes an array of pixel regions 101. For example, the pixel regions 101 are arranged into columns (for example, $C_1$ to $C_X$) and rows (for example, $R_1$ to $R_Y$). The term "pixel region" refers to a unit cell containing features such as a photodetector and various circuits. The unit cell may include various semiconductor devices for converting electromagnetic radiation into an electrical signal. The photodetectors in the pixel regions 101 may include photodiodes, complimentary metal-oxide-semiconductor (CMOS) image sensors, charged coupling device (CCD) sensors, active sensors, passive sensors, other applicable sensors, or a combination thereof.

In some embodiments, the pixel regions 101 are designed to have various sensor types. One group of pixel regions 101 may be CMOS image sensors, and another group of pixel regions 101 may be another type of sensors, such as passive sensors. In some embodiments, each pixel region 101 includes a photodetector, such as a photogate-type photodetector, for recording intensity or brightness of light (radiation). Each pixel region 101 may also include various semiconductor devices, such as various transistors.

Additional circuitry, inputs, and/or outputs are formed in a peripheral region of the image-sensor device structure 100 and are coupled to the pixel regions 101 in some embodiments. The circuitry in the peripheral region provides an operation environment for the pixel regions 101 and support communications with the pixel regions 101.

Figure 2:
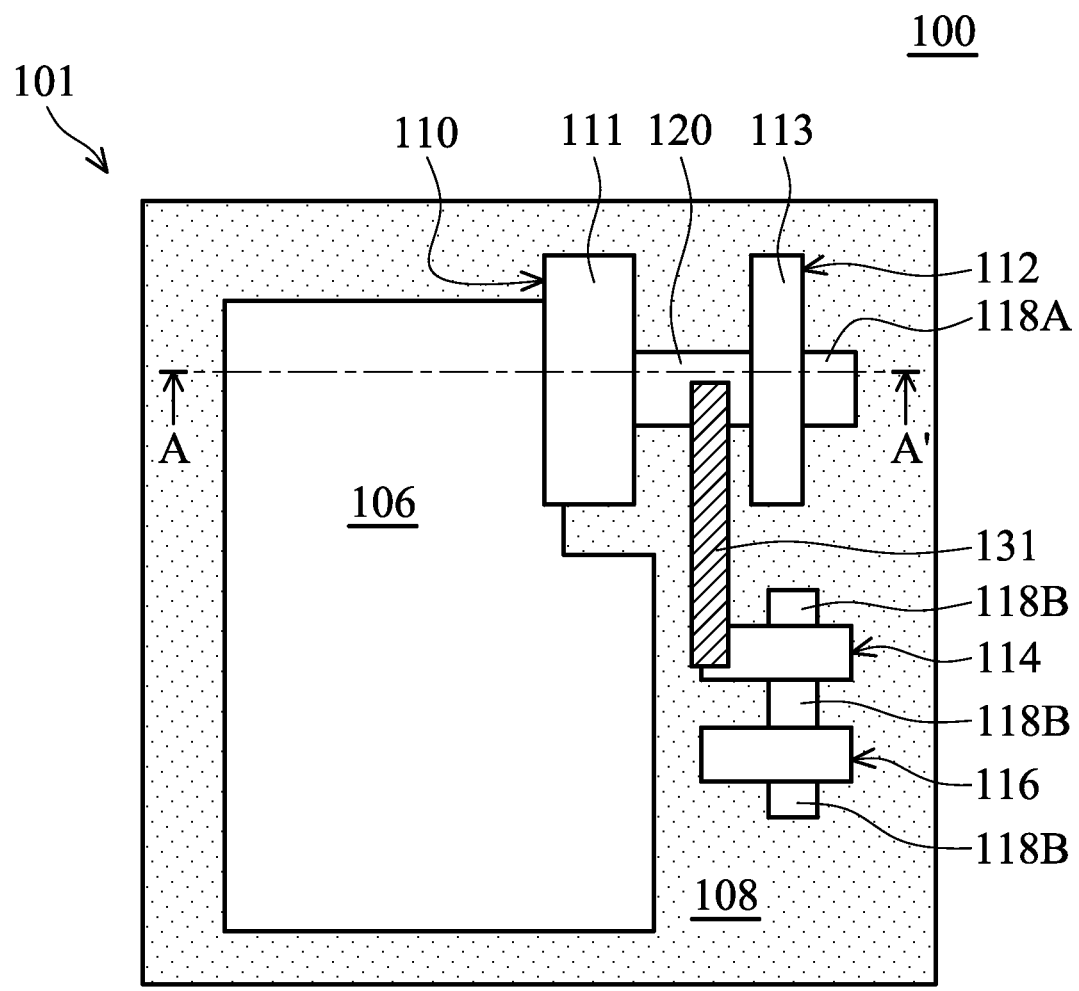
FIG. 2 is a top view of a pixel region of an image-sensor device structure, in accordance with some embodiments.

FIG. 2 is a top view of one of the pixel regions 101 of the image-sensor device structure 100, in accordance with some embodiments. As shown in FIG. 2, the pixel region 101 includes a light-sensing region 106. The light-sensing region 106 may be used as a photodetector. In some embodiments, the light-sensing region 106 includes a photodiode for recording intensity or brightness of light (radiation).

In some embodiments, the pixel region 101 contains various transistors. In some embodiments, the transistors include a transfer transistor 110, a reset transistor 112, a source-follower transistor 114, a select transistor 116, other suitable transistors, or a combination thereof. In some embodiments, one or some of the transistors mentioned above are not formed. In some other embodiments, one or more additional suitable devices such as transistors are further formed in the pixel region 101.

In some embodiments, the pixel region 101 includes various doped regions formed in the semiconductor substrate, such as doped regions 118A, 118B, and 120. For example, the doped regions 118A, 118B, and 120 serve as source/drain regions of the previously mentioned transistors. The doped region 120 is also referred to as a floating diffusion region in some embodiments. The doped region 120 is positioned between the transfer transistor 110 and the reset transistor 112, and is one of the source/drain regions for the transfer transistor 110 and the reset transistor 112.

As shown in FIG. 2, the transfer transistor 110 includes a gate stack 111 over a channel region between the doped region 120 and the light-sensing region 106, in accordance with some embodiments. In some embodiments, the reset transistor 112 includes a gate stack 113 over a channel region between the doped regions 120 and 118A. In some embodiments, a conductive feature 131 overlaps a portion of a gate stack of the source-follower transistor 114 and connects to the doped region 120. As shown in FIG. 2, the isolation structure 108 is formed in the pixel region 101 to isolate devices or doped regions formed in the semiconductor substrate.

The image-sensor device structure 100 further includes a color filter (not shown) and a lens (not shown) positioned over a front surface or a back surface of the semiconductor substrate in some embodiments. The color filter and the lens are aligned with the light-sensing region 106. In the operation of the image-sensor device structure 100 according to some embodiments, the image-sensor device structure 100 is designed to receive radiation traveling towards the front surface of the semiconductor substrate. The lens positioned over the front surface of the semiconductor substrate directs the incident radiation to the corresponding light-sensing region 106 in the semiconductor substrate. The incident radiation generates electron-hole pairs. When exposed to the incident radiation, the light-sensing region 106 responds to the incident radiation by accumulating electrons.

In some embodiments, the electrons are transferred from the light-sensing region 106 to the doped region 120 when the transfer transistor 110 is turned on. Through the connection of the conductive feature 131, the source-follower transistor 114 may convert the electrons from the doped region 120 to voltage signals. The select transistor 116 may allow a single row (or a single column) of the pixel array to be read by read-out electronics (not shown). The reset transistor 112 may act as a switch to reset the doped region 120. When the reset transistor 112 is turned on, the doped region 120 is connected to a power supply to clear all accumulated electrons.

Figure 3:
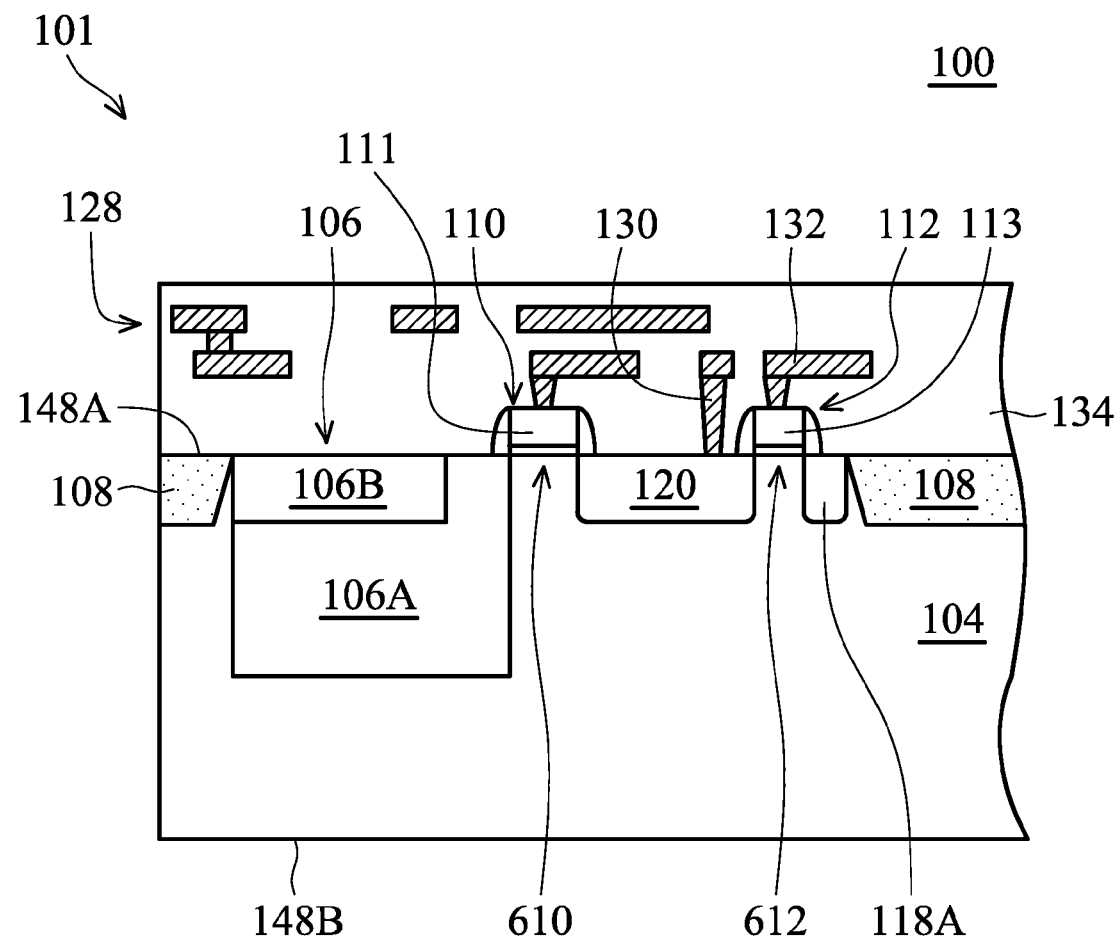
FIG. 3 is a cross-sectional view of an image-sensor device structure, in accordance with some embodiments.

FIG. 3 is a cross-sectional view of the pixel region of the image-sensor device structure 100 along the line A-A' in FIG. 2, in accordance with some embodiments. The image-sensor device structure 100 includes a semiconductor substrate 104 having a front surface 148A and a back surface 148B. In some embodiments, the semiconductor substrate 104 is a p-type doped substrate. P-type dopants, with which the semiconductor substrate 104 is doped, include boron, gallium, indium, other suitable p-type dopants, or a combination thereof. The semiconductor substrate 104 may alternatively be an n-type doped substrate. N-type dopants, with which the semiconductor substrate 104 is doped, include phosphorus, arsenic, other suitable n-type dopants, or a combination thereof. Doping may be implemented with a process such as ion implantation or diffusion, using various operations and techniques. In the following examples, a p-type doped substrate is taken as an example of the semiconductor substrate 104 for description.

As shown in FIGS. 2 and 3, the pixel region 101 includes the light-sensing region 106. In some embodiments, the light-sensing region 106 is a photodiode that includes a doped region 106A and a pinned layer 106B, as shown in FIG. 3. The doped region 106A is formed along the front surface 148A of the semiconductor substrate 104. In some embodiments, the doped region 106A is an n-type doped region. Accordingly, the pinned layer 106B is a p-type doped layer formed overlapping the doped region 106A at the front surface 148A of the semiconductor substrate 104. In some other embodiments, the doped region 106A is a p-type doped region while the semiconductor substrate 104 is an n-type doped substrate, and the pinned layer 106B is an n-type doped layer.

In some embodiments, the pixel region 101 includes various transistors, such as the transfer transistor 110, the reset transistor 112, the source-follower transistor 114 (shown in FIG. 2), and the select transistor 116 (shown in FIG. 2). Each transistor has a corresponding gate stack formed over the front surface 148A of the semiconductor substrate 104. For example, the transfer transistor 110 has the gate stack 111, and the reset transistor 112 has the gate stack 113. The gate stack 111 of the transfer transistor 110 may overlay a portion of the doped region 106A. The gate stack 111 may also cover a channel region 610 of the transfer transistor 110. The gate stack 113 of the reset transistor 112 may overlay a portion of the doped region 120 and a portion of the doped region 118A. The gate stack 113 may also cover a channel region 612 of the reset transistor 112.

The gate stack of each transistor includes a gate dielectric layer and a gate electrode layer (not shown). In some embodiments, the gate dielectric layer is made of a dielectric material, such as silicon oxide, a high-k dielectric material, other dielectric material, or combinations thereof. Examples of the high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, or a combination thereof. In some embodiments, the gate electrode layer includes polysilicon or metal materials. In some embodiments, the gate stack further includes main spacers.

As shown in FIG. 3, the image-sensor device structure 100 includes an interconnect structure 128 formed over the front surface 148A of the semiconductor substrate 104, in accordance with some embodiments. The interconnect structure 128 has various conductive features coupled to various components of the image-sensor device structure 100, such as the light-sensing region 106 or the transistors. Therefore, the various components of the image-sensor device structure 100 are operable to properly respond to illuminated light (imaging radiation).

As mentioned above, the interconnect structure 128 includes various conductive features. In some embodiments, the interconnect structure 128 includes vertical interconnects 130, such as contacts and/or vias, and horizontal interconnects 132, such as lines. The interconnect 132 includes the conductive feature 131 as shown in FIG. 2 in accordance with some embodiments. The various interconnects 130 and 132 are made of one or more conductive materials. In some embodiments, the conductive materials include aluminum, copper, titanium, titanium nitride, tungsten, polysilicon, metal silicide, other applicable materials, or a combination thereof.

The interconnect structure 128 includes an interlayer dielectric (ILD) structure 134, as shown in FIG. 3 in accordance with some embodiments. The conductive features, such as the interconnects 130 and 132, are embedded in the ILD structure 134. In some embodiments, the ILD structure 134 includes silicon oxide, silicon nitride, silicon oxynitride, tetraethylorthosilicate (TEOS) oxide, phosphosilicate glass (PSG), borophosphosilicate glass (BPSG), fluorinated silica glass (FSG), carbon doped silicon oxide, amorphous fluorinated carbon, low-k dielectric material, other suitable materials, or a combination thereof.

Embodiments of the disclosure have many variations. FIGS. 4A-4E are enlarged cross-sectional views of the image-sensor device structure 100, in accordance with some embodiments.

Figure 4A:
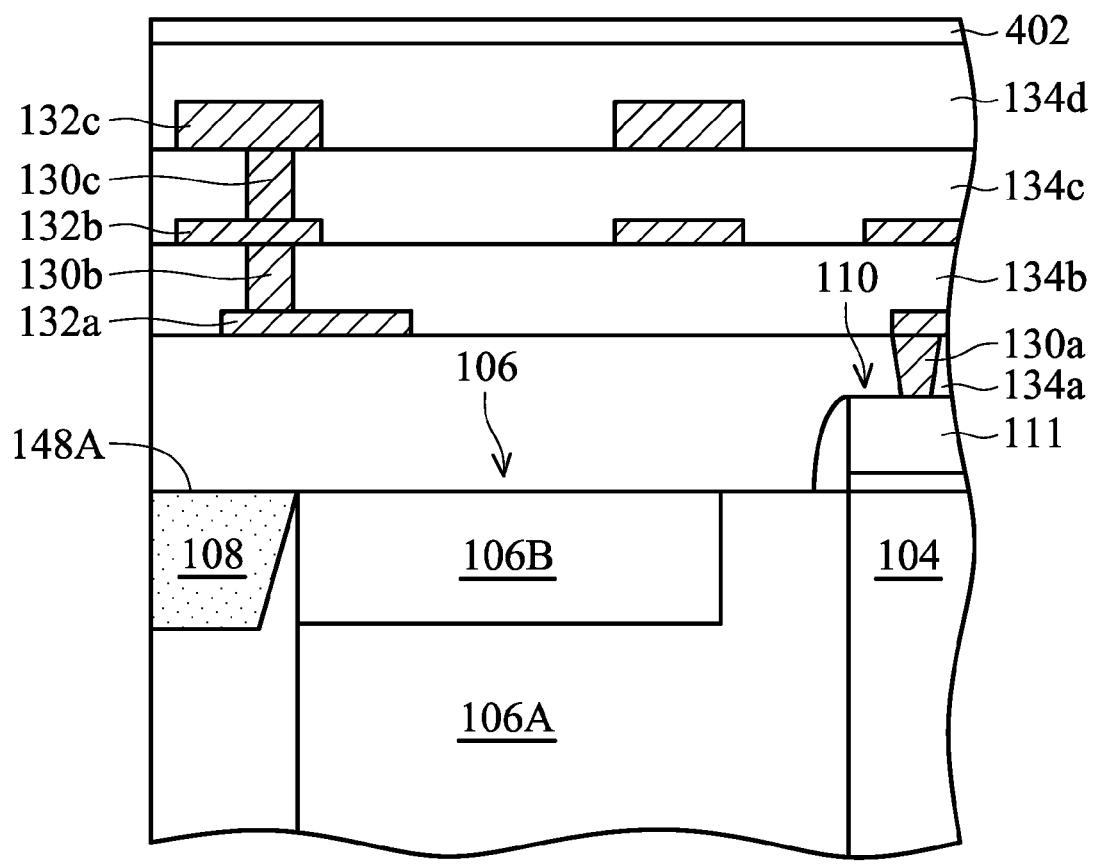
FIGS. 4A-4E are cross-sectional views of image-sensor device structures, in accordance with some embodiments.

As shown in FIG. 4A, the ILD structure (134) of the interconnect structure 128 includes multiple dielectric layers, in accordance with some embodiments. The interconnect structure 128 includes, for example, dielectric layers 134a, 134b, 134c, and 134d. In some embodiments, the conductive features of the interconnect structure 128 includes vertical interconnects and horizontal interconnects. For example, the vertical interconnects include interconnects 130a, 130b, and 130c. In some embodiments, the interconnect 130a is also referred to as a contact, and the interconnects 130b and 130c are also referred to as vias. The horizontal interconnects include interconnects 132a, 132b, and 132c. In some embodiments, the interconnects 132a, 132b, and 132c are also referred to as metal 1 (M1), metal 2 (M2), and metal 3 (M3), respectively. In some embodiments, the interconnect 132c is thicker than the interconnect 132a or 132b. The interconnect 132c has a thickness which may be in a range from about 3000 Å to about 4000 Å. The interconnect 132a or 132b has a smaller thickness which may be in a range from about 1000 Å to about 2000 Å.

In some embodiments, the interconnect 132c is prevented from being formed directly over the light-sensing region 106. Therefore, the incident light is prevented from being blocked and/or reflected by the interconnect 132c when it is traveling to the light sensing region 106. In some other embodiments, the interconnect 132b and/or 132a are also prevented from being formed directly over the light-sensing region 106.

In some embodiments, one (or more) of the multiple dielectric layers is a transparent dielectric layer with a high optical transmittance. For example, the high optical transmittance (such as visible light transmittance, UV light transmittance, or IR light transmittance) is higher than that of silicon oxide. In some embodiments, the visible light transmittance of the transparent dielectric layer is in a range from about 90% to about 97%. In some embodiments, the visible light transmittance of the transparent dielectric layer is in a range from about 90% to about 95%. In some other embodiments, the UV light transmittance of the transparent dielectric layer is in a range from about 90% to about 97%. In some other embodiments, the IR light transmittance of the transparent dielectric layer is in a range from about 90% to about 97%.

In some embodiments, the transparent dielectric layer includes a transparent polymer layer. In some embodiments, the transparent polymer layer includes polymethyl methacrylate (PMMA), polycarbonate (PC), epoxy, cellulose acetate, cellulose propionate, other suitable polymer materials, or a combination thereof. In some embodiments, the dielectric layer 134b is made of a transparent polymer material such as PMMA, and the dielectric layers 134a, 134c, and 134d include silicon oxide. In some other embodiments, the dielectric layers 134b, 134c, and 134d are made of a transparent polymer material such as PMMA, and the dielectric layer 134a includes silicon oxide.

In some embodiments, the transparent dielectric layer is deposited over the semiconductor substrate 104 using a spin-on process, a chemical vapor deposition (CVD) process, other applicable processes, or a combination thereof. Afterwards, the transparent dielectric layer is patterned to form openings for forming the vertical interconnects. In some embodiments, the transparent dielectric layer is partially removed and patterned using a photolithography process, a laser drilling process, an energy beam drilling process, an etching process, other applicable processes, or a combination thereof. In some embodiments, after the transparent dielectric layer (such as the dielectric layer 134c) is patterned, a vertical interconnect (such as the interconnect 132c) is formed in the transparent dielectric layer.

Referring to FIG. 4A, since one or more dielectric layers of the interconnect structure 128 have a high optical transmittance, the incident light, coming from the front side of the image-sensor device structure 100, penetrates through the interconnect structure 128 and enters the light-sensing region 106 more easily. A greater amount of incident light is sensed by the light-sensing region 106. Therefore, the sensitivity and the performance of the image-sensor device structure 100 are improved.

As shown in FIG. 4A, a passivation layer 402 is formed over the interconnect structure 128, in accordance with some embodiments. The passivation layer 402 is used to protect the image-sensor device structure 100. For example, the passivation layer 402 protects the image-sensor device structure 100 from being scratched and/or damaged by moisture. In some embodiments, the passivation layer 402 includes multiple layers. For example, the passivation layer 402 includes a silicon oxide layer and a silicon nitride layer.

Figure 4B:
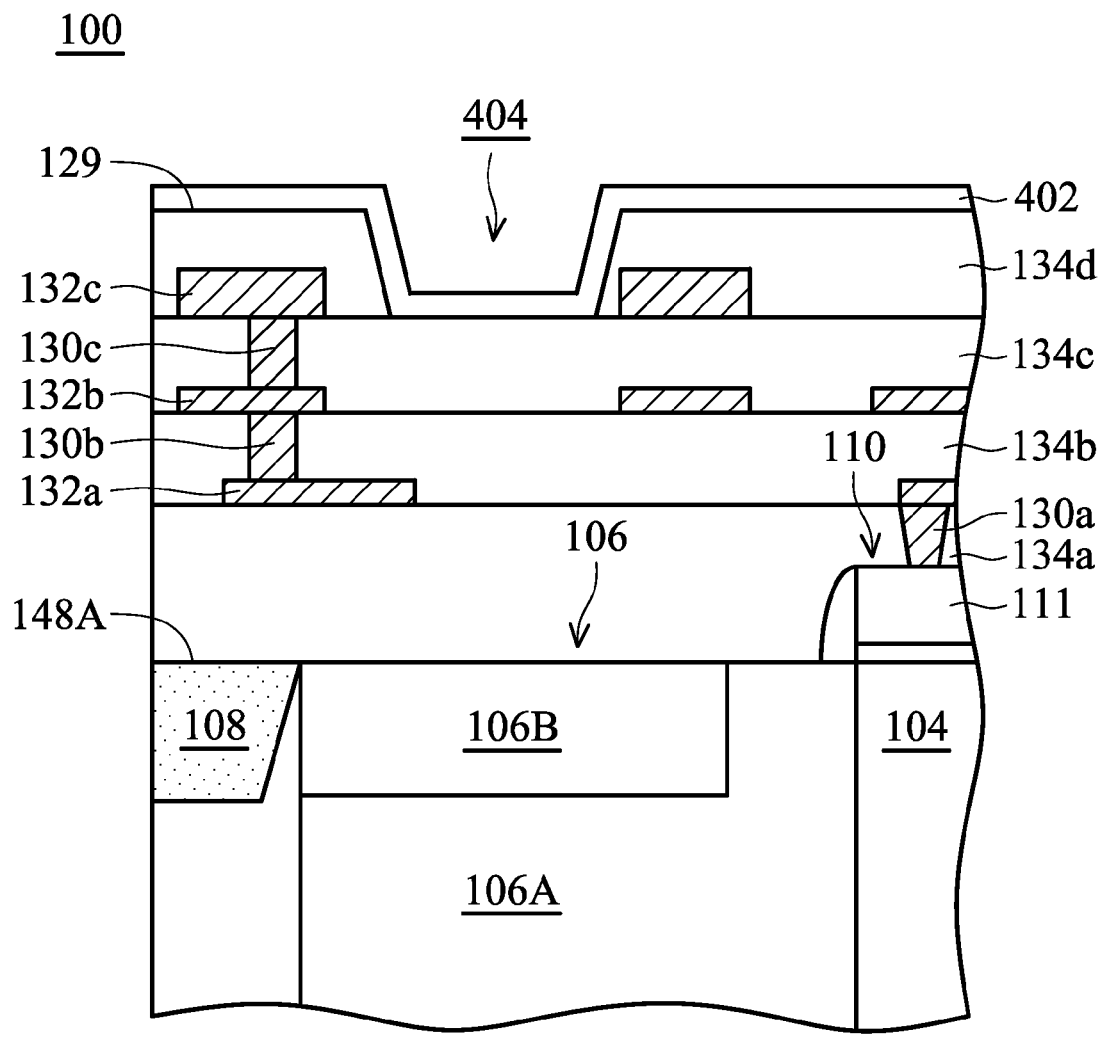

Embodiments of the disclosure have many variations. As shown in FIG. 4B, a portion of the ILD structure of the interconnect structure 128 is removed to form a recess 404, in accordance with some embodiments. In some embodiments, the interconnect structure 128 is partially removed from a surface 129 of the interconnect structure 128 to form the recess 404. The recess 404 extends towards the light-sensing region 106. In some embodiments, the recess 404 aligns with the light-sensing region 106.

In some embodiments, a mask layer (not shown) is formed over the dielectric layer 134d. The mask layer has an opening exposing the dielectric layer 134d. In some embodiments, the mask layer is a photoresist layer or a hard mask layer (such as a silicon nitride layer). With the mask layer as a mask, an etching process is performed to partially remove the dielectric layer 134d to form the recess 404. As shown in FIG. 4B, the recess 404 exposes a surface of the dielectric layer 134c.

In some embodiments, the dielectric layer 134d includes silicon oxide, and the dielectric layer 134c is a transparent dielectric layer with a high optical transmittance. In some embodiments, the dielectric layer 134c is made of a transparent polymer material. The transparent polymer material has an optical transmittance (such as visible light transmittance) ranging from about 90% to about 97%. In some embodiments, the transparent polymer material includes PMMA, PC, epoxy, cellulose acetate, cellulose propionate, other applicable polymer materials or a combination thereof. In some embodiments, the dielectric layer 134c, made of the transparent polymer material, also functions as an etch stop layer for forming the recess 404. In some embodiments, one or both of the dielectric layers 134b and 134a are made of the transparent polymer material(s). Embodiments of the disclosure have many variations. In some other embodiments, the dielectric layer 134d also includes a transparent polymer material. In some embodiments, some or all of the dielectric layers 134a, 134b, 134c, and 134d are made of different materials. For example, different kinds of transparent materials are used for forming the dielectric layers.

In some embodiments, the passivation layer 404 is deposited over the interconnect structure 128, in accordance with some embodiments. In some embodiments, the passivation layer 404 covers sidewalls and the bottom surface of the recess 404. In some embodiments, the passivation layer 404 conformally covers the surface 129 and the sidewalls and the bottom surface of the recess 404.

As shown in FIG. 4B, after the recess 404 is formed, a distance between the light-sensing region 106 and a light receiving surface (i.e., the bottom surface of the recess 404) is reduced. In some embodiments, some or all of the dielectric layers 134c, 134b, and 134a are made of the transparent polymer material(s) having a high optical transmittance. As a result, the incident light can penetrate through the interconnect structure 128 and enter the light-sensing region 106 more easily. A greater amount of incident light is sensed by the light-sensing region 106. Therefore, the sensitivity and the performance of the image-sensor device structure 100 are improved.

Figure 4C:
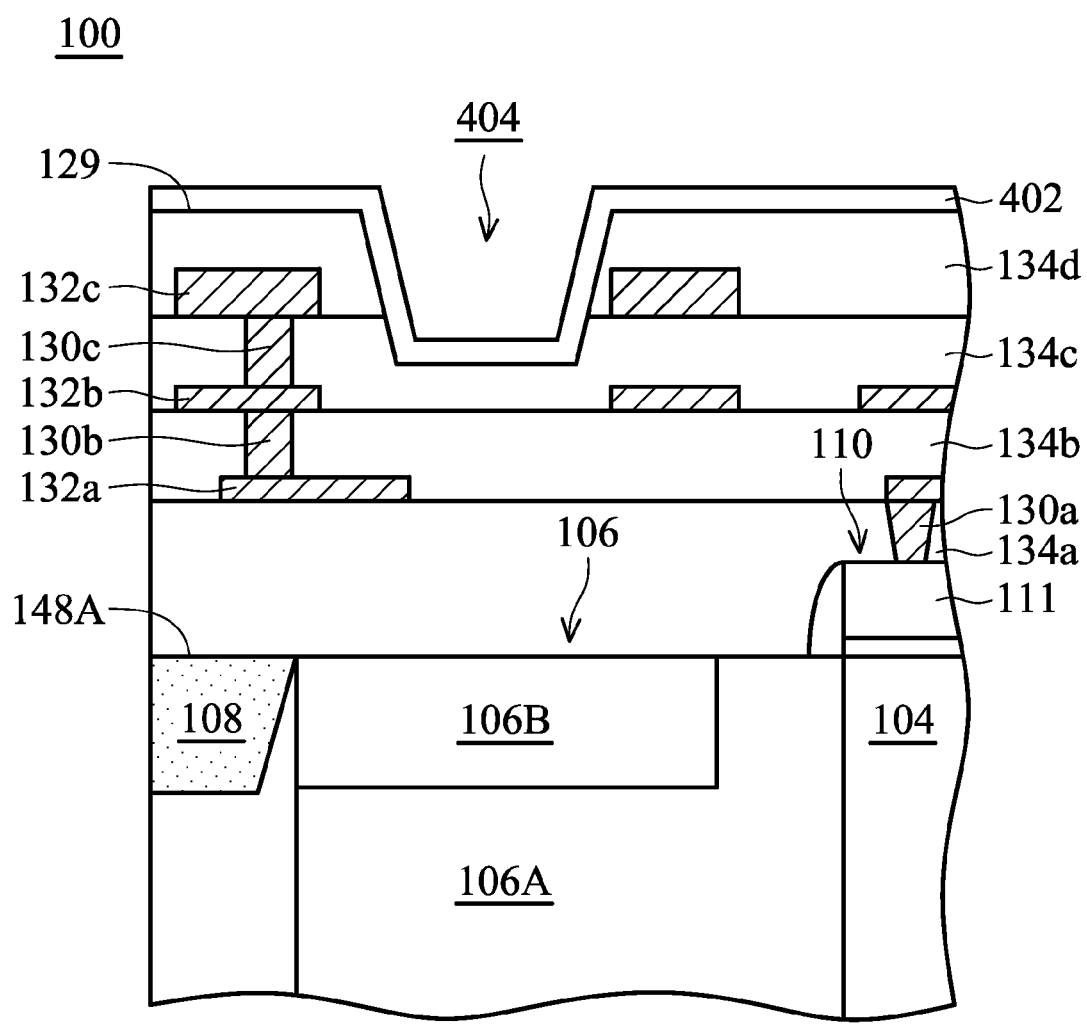

As shown in FIG. 4C, the recess 404 further extends into the dielectric layer 134c, in accordance with some embodiments. In some embodiments, the dielectric layer 134d includes silicon oxide, and the dielectric layer 134c is made of the transparent polymer material, such as PMMA. After the dielectric layer 134d is partially removed to expose the dielectric layer 134c, a portion of the dielectric layer 134c is further removed such that the recess 404 extends into the dielectric layer 134c. In some embodiments, the dielectric layers 134b and 134a include silicon oxide. In some other embodiments, one or both of the dielectric layers 134b and 134a include the transparent polymer material.

Figure 4D:
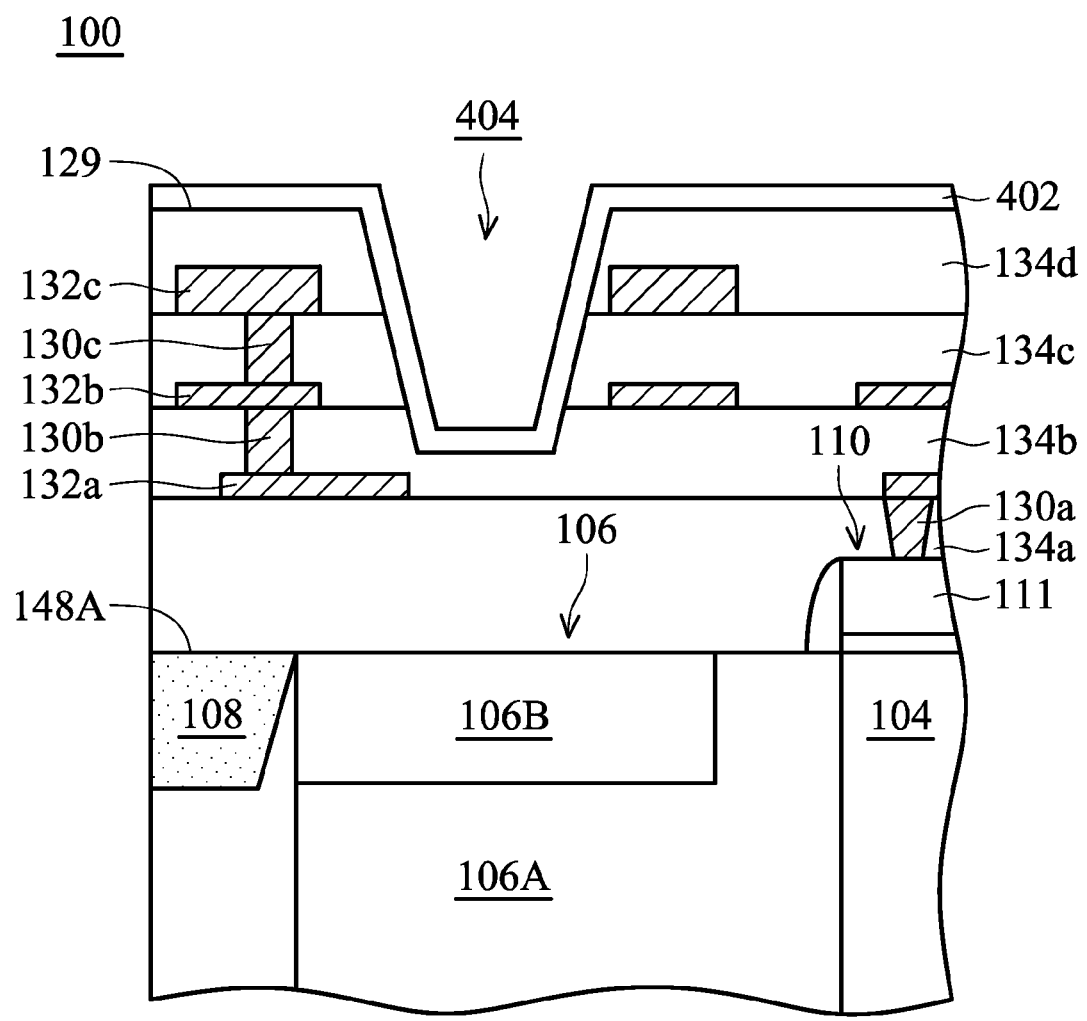
Figure 4E:
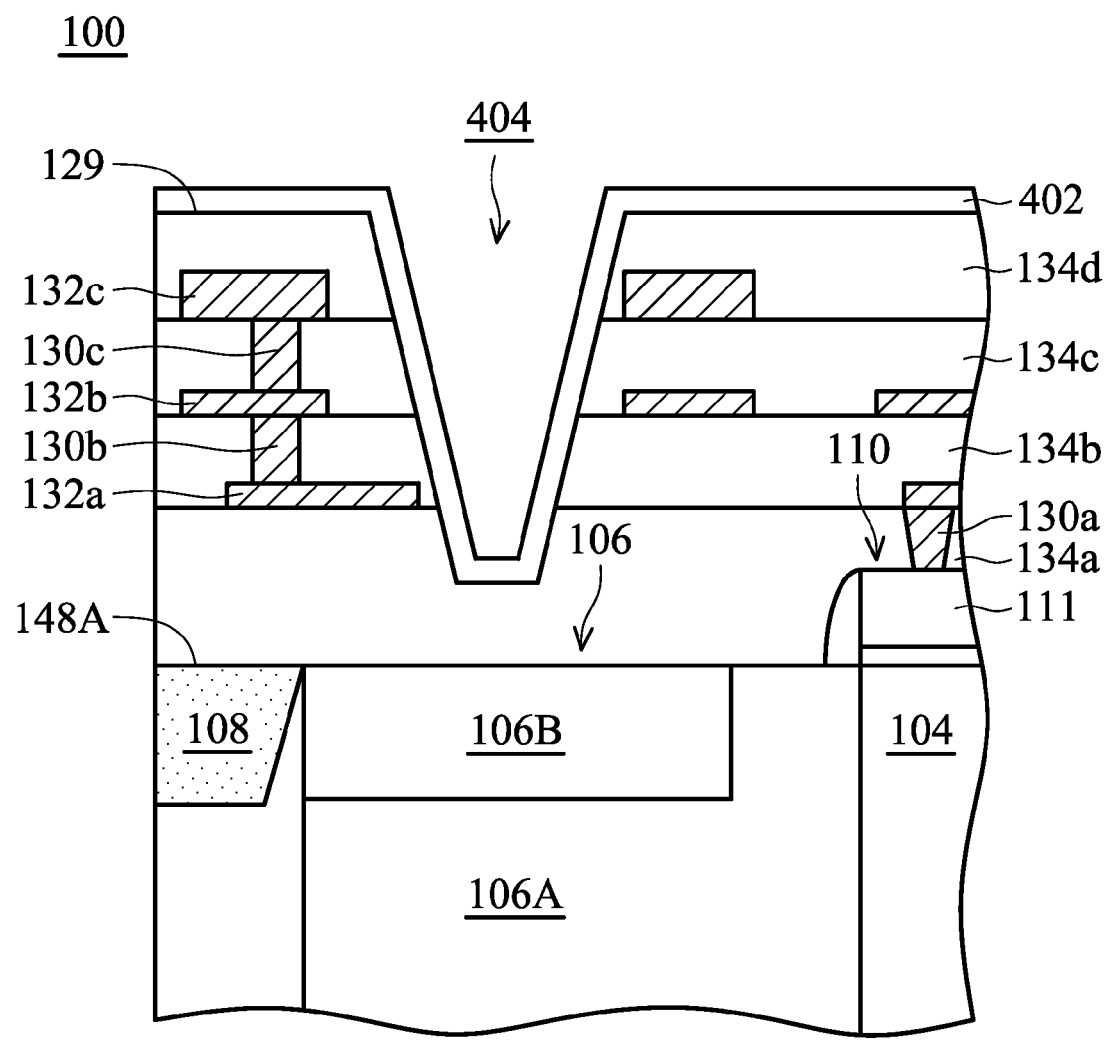

Embodiments of the disclosure have many variations. In some embodiments, the recess 404 penetrates through the dielectric layers 134d and 134c to expose the dielectric layer 134b. In these cases, the dielectric layer 134b includes the transparent polymer material, such as PMMA. In some embodiments, the dielectric layer 134a also includes the transparent polymer material. Alternatively, the dielectric layer 134a includes silicon oxide. In some embodiments, the recess 404 further extends into the dielectric layer 134b, as shown in FIG. 4D. In some embodiments, the recess 404 further penetrates through the dielectric layer 134b to expose the dielectric layer 134a. In some other embodiments, the recess 404 further extends into the dielectric layer 134a. In these cases, the dielectric layer 134a includes the transparent polymer material.

Embodiments of an image-sensor device structure and a method of manufacturing thereof are provided. One or more dielectric layers of an interconnect structure of the image-sensor device structure are transparent dielectric layer(s) with a high optical transmittance. For example, visible light transmittance of the transparent dielectric layer(s) is in a range from about 90% to about 97%. One or more transparent polymer materials are used as the transparent dielectric layers(s). The interconnect structure can be partially removed to form a recess extending towards a light-sensing region of the image-sensor device structure. As a result, an incident light penetrates through the interconnect structure and enters the light-sensing region more easily. A greater amount of incident light is sensed by the light-sensing region. Therefore, the sensitivity and the performance of the image-sensor device structure are improved.

In accordance with some embodiments, an image-sensor device structure is provided. The image-sensor device structure includes a semiconductor substrate and a light-sensing region in the semiconductor substrate. The image-sensor device structure also includes an interconnect structure over the semiconductor substrate, and the interconnect structure includes a transparent dielectric layer over the light-sensing region. The transparent dielectric layer has an optical transmittance ranging from about 90% to about 97%.

In accordance with some embodiments, an image-sensor device structure is provided. The image-sensor device structure includes a semiconductor substrate and a light-sensing region in the semiconductor substrate. The image-sensor device structure also includes a stack of dielectric layers over the semiconductor substrate. A portion of the stack of dielectric layers over the light-sensing region has visible light transmittance ranging from about 90% to about 97%. The image-sensor device structure further includes various interconnects embedded in the stack of dielectric layers.

In accordance with some embodiments, a method for forming an image-sensor device structure is provided. The method includes forming a light-sensing region in a semiconductor substrate. The method also includes forming an interconnect structure over the semiconductor substrate. The formation of the interconnect structure includes forming a transparent dielectric layer over the light-sensing region. The transparent dielectric layer has an optical transmittance ranging from about 90% to about 97%.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An image-sensor device structure, comprising:
a semiconductor substrate;
a light-sensing region in the semiconductor substrate;
an interconnect structure over the semiconductor substrate, wherein the interconnect structure comprises a transparent dielectric layer over the light-sensing region, and the transparent dielectric layer has an optical transmittance higher than silicon oxide and is in contact with the light-sensing region; and
a recess extending from a surface of the interconnect structure towards the light-sensing region, wherein the recess penetrates through a dielectric layer of the interconnect structure over the transparent dielectric layer and exposes the transparent dielectric layer without penetrating through the transparent dielectric layer, wherein the optical transmittance of the transparent dielectric layer is higher than an optical transmittance of the dielectric layer.

2. The image-sensor device structure as claimed in claim 1, wherein visible light transmittance of the transparent dielectric layers is in a range from about 90% to about 97%.

3. The image-sensor device structure as claimed in claim 1, wherein the transparent dielectric layer is a transparent polymer layer.

4. The image-sensor device structure as claimed in claim 1, wherein the transparent dielectric layer comprises polymethyl methacrylate (PMMA), polycarbonate (PC), epoxy, cellulose acetate, cellulose propionate, or a combination thereof.

5. The image-sensor device structure as claimed in claim 1, wherein the interconnect structure comprises a vertical interconnect and a horizontal interconnect, and the vertical interconnect and the horizontal interconnect are embedded in the transparent dielectric layer.

6. The image-sensor device structure as claimed in claim 1, wherein the recess penetrates through a dielectric layer of the interconnect structure over the transparent dielectric layer and extends into the transparent dielectric layer without penetrating through the transparent dielectric layer such that a bottom of the recess is below a top of the transparent dielectric layer, wherein the optical transmittance of the transparent dielectric layer is higher than an optical transmittance of the dielectric layer.

7. The image-sensor device structure as claimed in claim 1, wherein the dielectric layer comprises silicon oxide.

8. The image-sensor device structure as claimed in claim 1, wherein the interconnect structure comprises a stack of dielectric layers including the dielectric layer and the transparent dielectric layer, and the dielectric layer is a top layer of the stack of dielectric layers.

9. The image-sensor device structure as claimed in claim 1, wherein the transparent dielectric layer is in direct contact with the light-sensing region.

10. The image-sensor device structure as claimed in claim 1, wherein the recess is aligned with the light-sensing region.

11. An image-sensor device structure, comprising:
a semiconductor substrate;
a light-sensing region in the semiconductor substrate;
a stack of dielectric layers over the semiconductor substrate, wherein a first dielectric layer of the stack of dielectric layers over the light-sensing region has visible light transmittance higher than silicon oxide and is in contact with the light-sensing region;
a recess extending from a surface of the stack of dielectric layers towards the light-sensing region, wherein the recess penetrates through a second dielectric layer of the stack of dielectric layers that is above the first dielectric layer and exposes the first dielectric layer without penetrating through the first dielectric layer, wherein the visible light transmittance of the first dielectric layer is higher than visible light transmittance of the second dielectric layer; and
a plurality of interconnects embedded in the stack of dielectric layers.

12. The image-sensor device structure as claimed in claim 11, wherein the first dielectric layer of the stack of dielectric layers comprises a transparent polymer material.

13. The image-sensor device structure as claimed in claim 11, wherein the second dielectric layer of the stack of dielectric layers comprises silicon oxide.

14. The image-sensor device structure as claimed in claim 13, wherein the second dielectric layer of the stack of dielectric layers is a top layer of the stack of dielectric layers.

15. The image-sensor device structure as claimed in claim 13, wherein the recess penetrates into the first dielectric layer of the stack of dielectric layers without penetrating through the first dielectric layer such that a bottom of the recess is below a top of the first dielectric layer of the stack of dielectric layers.

16. An image-sensor device structure, comprising:
a semiconductor substrate;
a light-sensing region in the semiconductor substrate;
a stack of dielectric layers over the semiconductor substrate, wherein a first dielectric layer of the stack of dielectric layers over the light-sensing region has an optical transmittance higher than silicon oxide and is in contact with the light-sensing region; and
a recess extending from a surface of the stack of dielectric layers towards the light-sensing region, wherein the recess penetrates through a second dielectric layer of the stack of dielectric layers that is above the first dielectric layer and exposes the first dielectric layer without penetrating through the first dielectric layer, wherein the optical transmittance of the first dielectric layer is higher than an optical light transmittance of the second dielectric layer.

17. The image-sensor device structure as claimed in claim 16, wherein the first dielectric layer of the stack of dielectric layers comprises one or more transparent polymer layers.

18. The image-sensor device structure as claimed in claim 17, wherein the one or more transparent polymer layers comprise polymethyl methacrylate (PMMA), polycarbonate (PC), expoxy, cellulose acetate, cellulose propionate, or a combination thereof.

19. The image-sensor device structure as claimed in claim 16, wherein the recess penetrates into the first dielectric layer of the stack of dielectric layers without penetrating through the first dielectric layer such that a bottom of the recess is below a top of the first dielectric layer of the stack of dielectric layers.

20. The image-sensor device structure as claimed in claim 16, wherein the recess aligns with the light-sensing region.

\* \* \* \* \*